(12) United States Patent
Kim et al.

(10) Patent No.: US 9,221,025 B2
(45) Date of Patent: Dec. 29, 2015

(54) METHOD OF COATING SURFACE OF INORGANIC POWDER PARTICLES WITH SILICON-CARBON COMPOSITE AND INORGANIC POWDER PARTICLES COATED BY THE SAME

(75) Inventors: Young Dok Kim, Suwon-si (KR); Kwang Dae Kim, Incheon (KR); Myoung Geun Jung, Seoul (KR); Hyun Ook Seo, Seoul (KR); Dong Chan Lim, Seoul (KR); Chae Won Sim, Changwon-si (KR); Jong Won Nam, Incheon (KR); Dong Wun Kim, Seoul (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 589 days.

(21) Appl. No.: 13/557,661

(22) Filed: Jul. 25, 2012

(65) Prior Publication Data
US 2013/0029041 A1    Jan. 31, 2013

(30) Foreign Application Priority Data
Jul. 25, 2011  (KR) .................. 10-2011-0073767

(51) Int. Cl.
C23C 16/00 (2006.01)
B01J 2/00 (2006.01)
C23C 16/448 (2006.01)
C23C 16/44 (2006.01)
C23C 16/32 (2006.01)

(52) U.S. Cl.
CPC *B01J 2/006* (2013.01); *B01J 2/003* (2013.01); *C23C 16/325* (2013.01); *C23C 16/4417* (2013.01); *C23C 16/4486* (2013.01)

(58) Field of Classification Search
USPC ........................................... 427/221
See application file for complete search history.

(56) References Cited

U.S. PATENT DOCUMENTS 5,458,976 A * 10/1995 Horino et al. ................. 428/405
2007/0009657 A1* 1/2007 Zhang et al. .................. 427/180
2010/0129994 A1* 5/2010 Awad et al. ................... 438/483

FOREIGN PATENT DOCUMENTS

| JP | 02-298274 | 12/1990 |
| JP | 2698819 | 9/1997 |
| KR | 10-2006-0128353 | 12/2006 |
| WO | WO 2006/132465 | * 12/2006 |

OTHER PUBLICATIONS

Jeong et al, J. Mater. Sci., 47, pp. 5190-5196, published online Mar. 23, 2012.*
Seo et al, Macromolecular Research, 20 (2), pp. 216-219, 2012.*
Kim et al, Powder Technology, 139, pp. 81-88, 2004.*
Korean Office Action issued Mar. 22, 2013 in counterpart Korean Patent Application No. 10-2011-0073767. (3 pages in Korean).
Korean Office Action issued Oct. 31, 2012 in counterpart Korean Application No. 10-2011-0073767 (8 pages, including English language translation).
Korean Office Action issued Mar. 22, 2013 in counterpart Application No. KR 10-2011-0073767 (4 pages in Korean, with English language translation).

* cited by examiner

*Primary Examiner* — Erma Cameron
(74) *Attorney, Agent, or Firm* — NSIP Law

(57) ABSTRACT

The present invention relates to a method of coating the surface of inorganic powder particles with a silicon-carbon composite and to inorganic powder particles coated by the method. More specifically, the invention relates to a method of coating the surface of inorganic powder particles with a silicon-carbon composite by mixing inorganic powder particles with a solid organic silicon polymer and heating the mixture, and to inorganic powder particles coated by the method.

8 Claims, 11 Drawing Sheets

Fig. 7
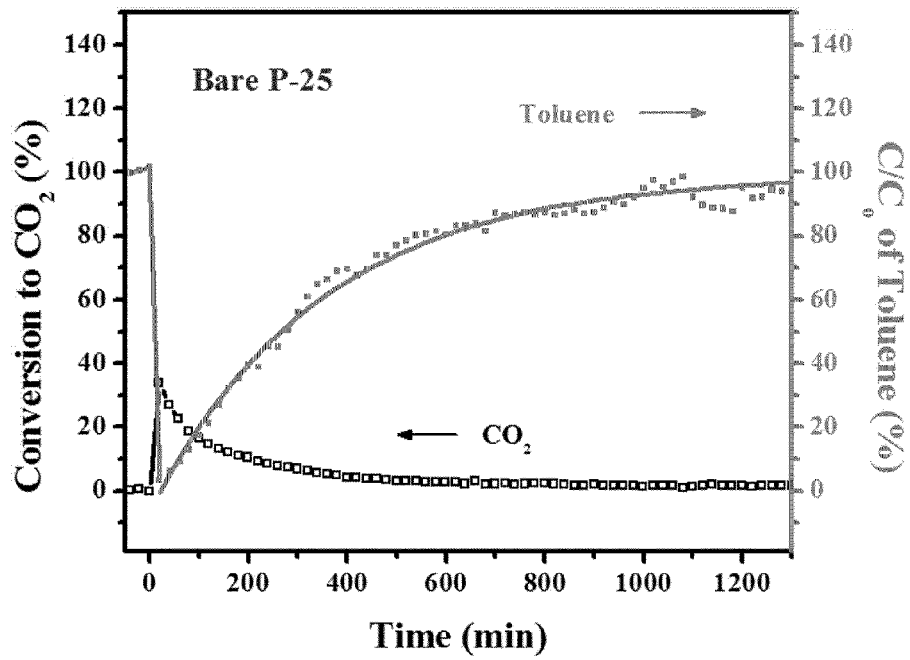
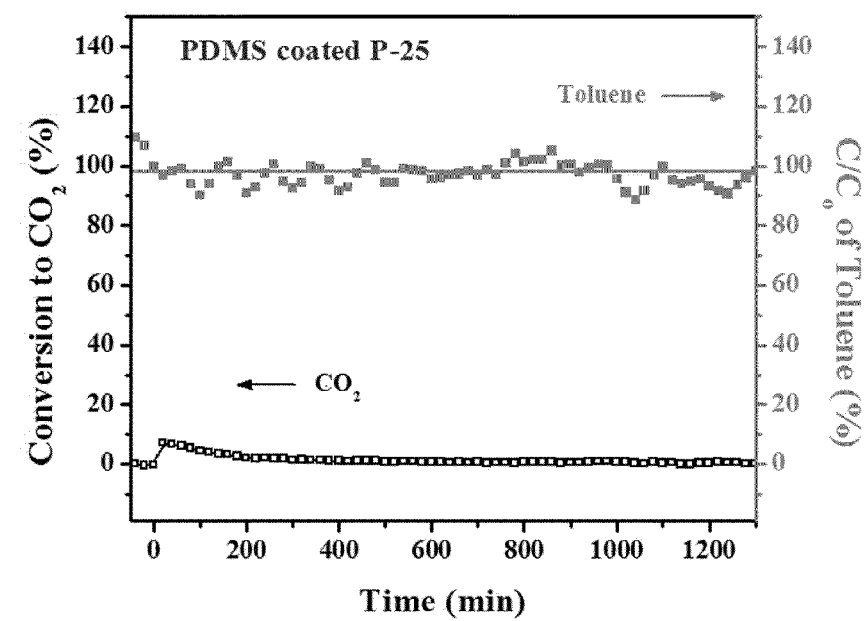

Fig. 11
a) 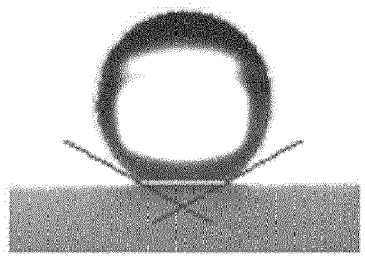
169.14°
b) 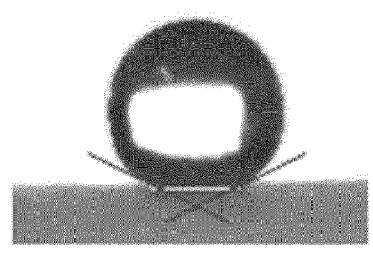
168.01°

METHOD OF COATING SURFACE OF INORGANIC POWDER PARTICLES WITH SILICON-CARBON COMPOSITE AND INORGANIC POWDER PARTICLES COATED BY THE SAME

BACKGROUND OF THE INVENTION

1. Field of the Invention

The present invention relates to a method of coating the surface of inorganic powder particles with a silicon-carbon composite and to inorganic powder particles coated by the method. More particularly, the present invention relates to a method of coating the surface of inorganic powder particles with a silicon-carbon composite by mixing inorganic powder particles with a solid organic silicon polymer and heating the mixture, and to inorganic powder particles coated by the method.

2. Description of the Prior Art

A super-hydrophobic surface refers to a surface having a water contact angle of 150° or higher, and has self-cleaning, anti-fogging and water-proof functions. In nature, this phenomenon is observed in lotus or taro leaves and insect wings and legs and is referred to as the lotus effect. It is observed that the surface structures of the above leaves and insect wings and legs have a double structure of a micro-sized structure and a nano-sized structure. Namely, nano-sized protrusions are present on the surface of micro-sized structures to show the super-hydrophobic phenomenon in which water droplets roll down without adhering to the surface. This super-hydrophobic surface is applied in various fields, including inhibitors of the photocatalytic activity of cosmetic products, interior and exterior materials for buildings, organic and inorganic antioxidant films and waterproof fibers, and many studies thereon have been conducted.

In the prior art, many methods for obtaining super-hydrophobic surfaces were reported, including a method of increasing the water contact angle of a solid by controlling the surface roughness or a coating method which based on the self-assembly of hydrophobic organic molecules (e.g., stearic acid). Particularly, a method that uses organic molecules is widely used, because the organic molecules are strongly hydrophobic in nature. However, these organic molecules are significantly unstable so that they are easily degraded by light irradiation or the chemical composition thereof is changed.

Because UV rays cause various skin diseases, burns, cancer and the like, the harmfulness of UV rays has been increasingly recognized and agents for blocking UV rays have been developed. UV blocking agents can be broadly divided into inorganic UV scattering agents and organic UV absorbents. The organic UV absorbents absorb mainly middle-wavelength UV light and convert the light to vibration or fluorescence energy, thus protecting the skin from the light. On the other hand, the inorganic UV scattering agents scatter and block long-wavelength UV light, and specific examples thereof include titanium dioxide, zinc oxide, zirconium oxide and the like. The inorganic UV blocking agents are more stable than the organic UV blocking agents and can block off a wide range of UV light, and thus have received increasing attention. Particularly, titanium dioxide has a high refractive index, and thus can effectively scatter and block light. In addition, it is harmless to the human body. Due to such advantages, titanium dioxide is frequently used as a UV blocking agent. However, titanium dioxide shows high photoactivity when it is irradiated with UV light. Thus, when it is used together with other cosmetic materials, it degrades or modifies these cosmetic materials. In addition, it can produce strongly oxidative OH radicals or $O_2^-$, which can promote skin aging. For this reason, efforts have been made to coat the surface of these UV blocking agents with a thin film, thus scattering or absorbing UV while inhibiting the photoactivity of the UV blocking agents.

With the accelerated development of display devices and electronic energy devices, the development of printing technology has become essential in various fields, including electronic device processes, material manufacturing processes, and biotechnology, and studies thereon have been actively conducted. In addition, the printing method is inexpensive, is not complicated and is not time-consuming, and thus is frequently used in industrial applications. For example, in the display field, an inkjet printing technique is used in a process of obtaining patterns using conductive metal nanopowder. However, the printing process has a problem in that the metal powder is oxidized when it is heat-treated or dispersed in a solvent, and thus the conductivity thereof is reduced. In order to solve this problem, the development of a coating technique for forming a film for preventing the oxidation of metal powder is urgently required.

Accordingly, the present inventors have conducted studies in view of the above problems, and as a result, have found that, when the surface of inorganic powder particles is coated with a solid organic silicon polymer using a vapor deposition method by mixing the inorganic powder particles with the solid organic silicon polymer and heating the mixture, a coating film can be formed which is thin and uniform compared to that formed by a liquid coating method, and also found that the coating film is highly stable against UV light and has an antioxidant effect, thereby completing the present invention.

SUMMARY OF THE INVENTION

It is an object of the present invention to provide a method of coating the surface of inorganic powder particles with a silicon-carbon composite.

Another object of the present invention is to provide inorganic powder particles having a silicon-carbon composite coated on the surface thereof.

DETAILED DESCRIPTION OF INVENTION

To achieve the above objects, the present invention provides a method of coating the surface of inorganic powder particles with a silicon-carbon composite, the method comprising the steps of:

1) mixing inorganic powder particles with a solid organic silicon polymer to form a mixture; and 2) heating the mixture.

In step 1), the inorganic powder particles to be coated with the silicon-carbon composite are mixed with the solid organic silicon polymer which is a precursor for forming the silicon-carbon composite.

In the prior art, a liquid coating method has been used to coat the surface of inorganic powder particles with a functional coating film. This liquid coating method has a shortcoming in that it is difficult to form a thin and uniform coating film. Particularly, it is difficult for the liquid coating method to obtain a super-hydrophobic coating surface, because the water contact angle of the coated surface is low.

The present invention has been made in order to overcome this shortcoming of the prior art and has a technical feature in that the surface of inorganic powder particles is coated with a solid organic silicon polymer by vapor deposition. In the present invention, the organic silicon polymer is used in a solution using solvent. Alternatively, when the organic silicon polymer is a liquid material, it is used in a solid state prepared by separate treatment.

As the inorganic powder particles, any material may be used, as long as it is in powder form. Specifically, the inorganic powder particles may be one or more selected from the group consisting of titanium dioxide, zinc oxide, zirconium oxide, copper, nickel, carbon fiber and activated carbon.

The solid organic silicon polymer can be obtained by adding a curing agent to an organic silicon polymer.

Specifically, examples of the organic silicon polymer include, but are not limited to, polydimethylsiloxane, polyvinylsiloxane, polyphenylmethylsiloxane and the like.

The curing agent that is used in the present invention may be organic peroxide, but is not limited thereto. The organic peroxide may be one or more selected from the group consisting of di-(2,4-dichlorobenzoyl)-peroxide, dibenzoyl peroxide, tert-butylcumyl peroxide, and di-tert-butyl peroxide.

In step 2), the solid organic silicon polymer that is a precursor for forming a silicon-carbon composite is heated to induce the formation of a silicon-carbon composite coating film on the surface of the inorganic powder particles.

The heating in step 2) is preferably carried out in a closed vessel.

The vessel that is used in the present invention is preferably made of a material selected from the group consisting of stainless steel, copper, aluminum, steel, titanium, and alloys thereof, and glass, but is not limited thereto.

The heating in step 2) is preferably carried out at a temperature of 150-300° C. The heating temperature can be suitably be determined according to the kind of solid organic silicon polymer used.

The heating is preferably carried out for 30 minutes to 1 hour. The heating time can suitably be determined according to the kind of solid organic silicon polymer used.

The present invention also provides inorganic powder particles having a silicon-carbon composite coated on the surface thereof.

The inorganic powder particles having a silicon-carbon composite coated on the surface as described above are highly stable even after exposure to UV light for a long time, and oxidation of the surface thereof is inhibited.

If the inorganic powder particles are titanium dioxide particles, they are highly stable against UV light, and the photoactivity thereof is inhibited. Thus, these inorganic powder particles can be applied as UV blocking agents.

The present invention also provides a UV blocking composition, a cosmetic composition, or an interior or exterior composition for buildings, which comprises the inorganic powder particles of the present invention.

The present invention also provides a super-hydrophobic coating composition comprising said inorganic powder particles.

The super-hydrophobic coating composition may be used as a painting composition for semiconductor devices or display devices.

Effect of the Invention

As described above, the present invention provides a vapor deposition method of coating the surface of inorganic powder particles with a solid organic silicon polymer by mixing the inorganic powder particles with the solid organic silicon polymer and heating the mixture. The coating film formed by the method of the present invention is thin and uniform compared to the coating film formed by a liquid coating method.

In addition, according to the method of the present invention, a super-hydrophobic silicon-carbon composite coating film which is highly stable against UV light can be formed. When the super-hydrophobic silicon-carbon composite coating film is applied to UV blocking agents such as titanium dioxide, it can inhibit the photoactivity of the UV blocking agents, and thus can solve the problems occurring in the prior art, including promotion of skin aging by the generation of strongly reactive species, and the degradation and modification of other cosmetic materials.

Furthermore, when the silicon-carbon composite coating according to the present invention is applied to organic and inorganic materials, it can serve as an antioxidant film, which inhibits oxidation of the materials by preventing the access of water or oxygen by its super-hydrophobicity. Accordingly, the silicon-carbon composite coating according to the present invention can be used as an antioxidant film for various materials.

BRIEF DESCRIPTION OF THE DRAWINGS

In FIGS. 3, (a), (b), (c) and (d) show spectra corresponding to the core levels of Ti 2p, C 1s, O 1s and Si 2p, respectively.

FIG. 7 shows the results of evaluating the photoactivities of a non-coated P-25 titanium dioxide sample (a) and a sample coated with a super-hydrophobic silicon-carbon composite (b) under irradiation with UV light (365 nm) by measuring the removal of toluene. The changes in concentrations of toluene and carbon dioxide as a function of time can be observed.

FIG. 8(a) shows a wide range of spectrum (700-4000 $cm^{-1}$), and FIGS. 8(b) and 8(c) show spectra obtained by enlarging the ranges of 700-1400 and 2800-3000 $cm^{-1}$, respectively, to closely observe the peaks produced by a super-hydrophobic silicon-carbon composite.

FIG. 11 shows the results of measuring the waster contact angles of titanium dioxide coated with super-hydrophobic silicon-carbon composite using gel polymethylsiloxane (a) and solid polymethylsiloxane (b).

DETAILED DESCRIPTION OF THE PREFERRED EMBODIMENTS

Hereinafter, the present invention will be described in detail.

Figure 1:
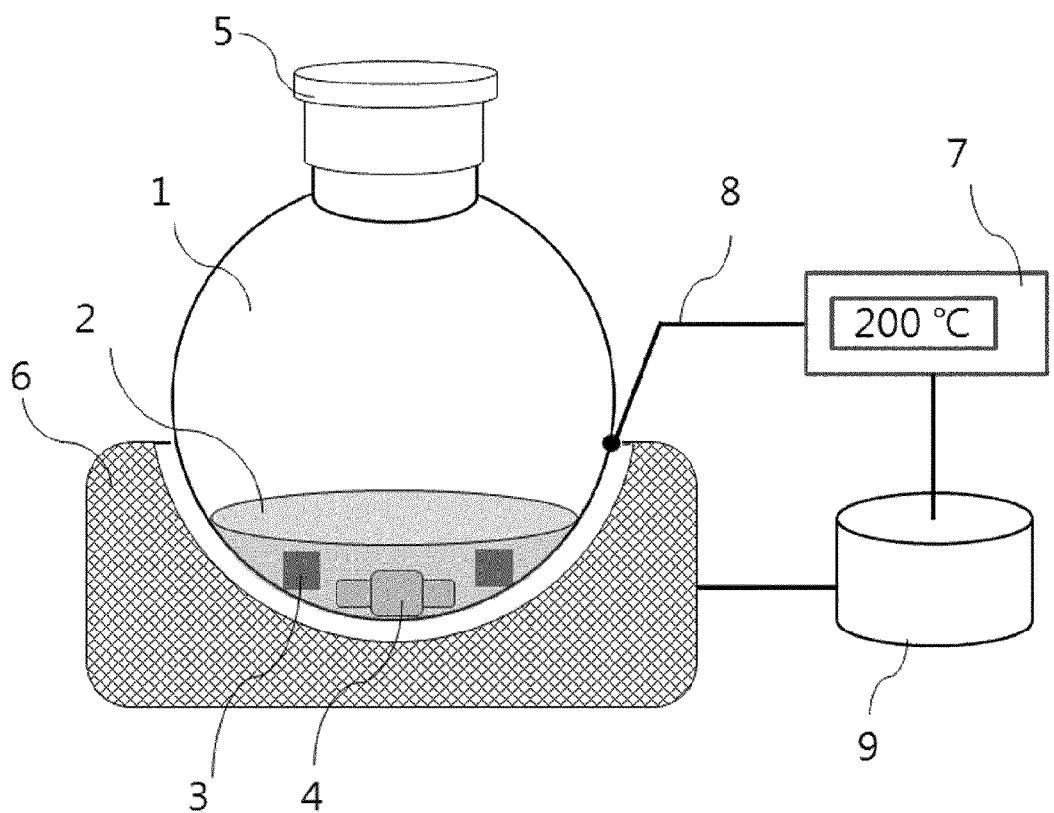
FIG. 1 schematically shows an apparatus for coating with a super-hydrophobic silicon-carbon composite according to the present invention.

FIG. 1 schematically shows a reaction apparatus for coating the surface of inorganic powder particles with a silicon-carbon composite.

As shown in FIG. 1, inorganic powder particles 2, a silicon-carbon composite 3, and a magnetic stirrer 4 is placed in the reactor 1. Magnetic stirrer 4 is used in order to uniformly coat the surface of the inorganic powder particles with the composite, after which the reactor is sealed with a rubber stopper 5. The reactor prepared as described above is equipped with a heating mesh bag and a magnetic stirrer device 6, and the inorganic powder particles are uniformly stirred so that they can be reacted with the composite.

Using a temperature controller 7, a thermocouple 8 and a voltage controller 9, the reactor is heated and maintained at a temperature of 150° C. or higher for a predetermined time or longer. After this process, inorganic powder particles coated with the silicon-carbon composite can be obtained.

In the above-prepared inorganic powder particles coated with the silicon-carbon composite, the silicon-carbon composite film is formed on the surface of the inorganic powder particles by vapor deposition and is thin and uniform.

Because this silicon-carbon composite coating film is thin and uniform compared to that formed by a liquid coating method, it has a high contact angle, and thus can provide a highly super-hydrophobic surface. Because titanium dioxide effectively scatters and blocks UV rays, and thus is frequently used as UV blocking agents. However, titanium dioxide shows high photoactivity upon UV irradiation, and thus when it is used together with other cosmetic materials, it degrades or modifies these cosmetic materials. In addition, it can produce strongly oxidative radicals, which can promote skin aging.

In the prior art, super-hydrophobic coating was frequently carried out using the self-assembly of organic molecules such as stearic acid. However, these organic molecules are easily degraded by UV rays, and thus are difficult to apply as UV blocking agents or antioxidant films.

The silicon-carbon composite coating film according to the present invention is not degraded or deformed because of its high stability even after exposure to UV light for a long period of time. In addition, the silicon-carbon composite coating film according to the present invention can inhibit the activity of photocatalysts such as titanium dioxide. Thus, when the silicon-carbon composite coating film according to the present invention is applied to UV-blocking agents, it can solve the problems occurring in the prior art, including the degradation or deformation of other materials by the high photoactivity of the UV-blocking agents.

Furthermore, when the silicon-carbon composite coating film is applied to organic and inorganic materials, it can serve as an antioxidant film, which inhibits oxidation of the materials by preventing the access of water or oxygen by its super-hydrophobicity.

The super-hydrophobic silicon-carbon composite according to the present invention can be widely used in various applications, including coating agents for inhibiting the photocatalytic activity of inorganic scattering agents used in cosmetic products, waterproof materials for buildings, antioxidant films for organic and inorganic materials, etc.

Hereinafter, the present invention will be described in further detail with reference to examples. It is to be understood, however, that these examples are for illustrative purposes only and are not intended to limit the scope of the present invention thereto.

Example 1

Preparation of Super-Hydrophobic $TiO_2$ Coated with Silicon-Carbon Composite

As shown in FIG. 1, inorganic powder particles 2 and polydimethylsiloxane (PDMS) 3, a precursor for forming a silicon-carbon composite, were placed in a reactor 1, and a magnetic stirrer 4 was placed in the reactor in order to uniformly coat the surface of the inorganic powder particles with the composite, after which the reactor was sealed with a rubber stopper 5. The inorganic powder particles used in Example 1 were Degussa P-25 titanium dioxide powder particles (about 20-30 nm). The above-prepared reactor was equipped with a heating mesh bag and a magnetic stirrer device 6, and the inorganic powder particles were uniformly stirred during the process. Using a temperature controller 7, a thermocouple 8 and a voltage controller 9, the reactor was heated and maintained at 200° C. for 1 hour. After the above process, titanium dioxide powder particles coated with a super-hydrophobic silicon-carbon composite were obtained.

Comparative Example 1

Preparation of $TiO_2$ Powder Coated with Stearic Acid

P-25 titanium dioxide coated with stearic acid was prepared in the following manner.

1 g of titanium dioxide powder was added to a 5 mM solution of stearic acid in ethanol and sonicated for 20 minutes. After sonication, the titanium dioxide was immersed in a solution for 1 day, and then the solution was removed, followed by completely drying the coated titanium dioxide at room temperature.

Test Example 1

Figure 2:
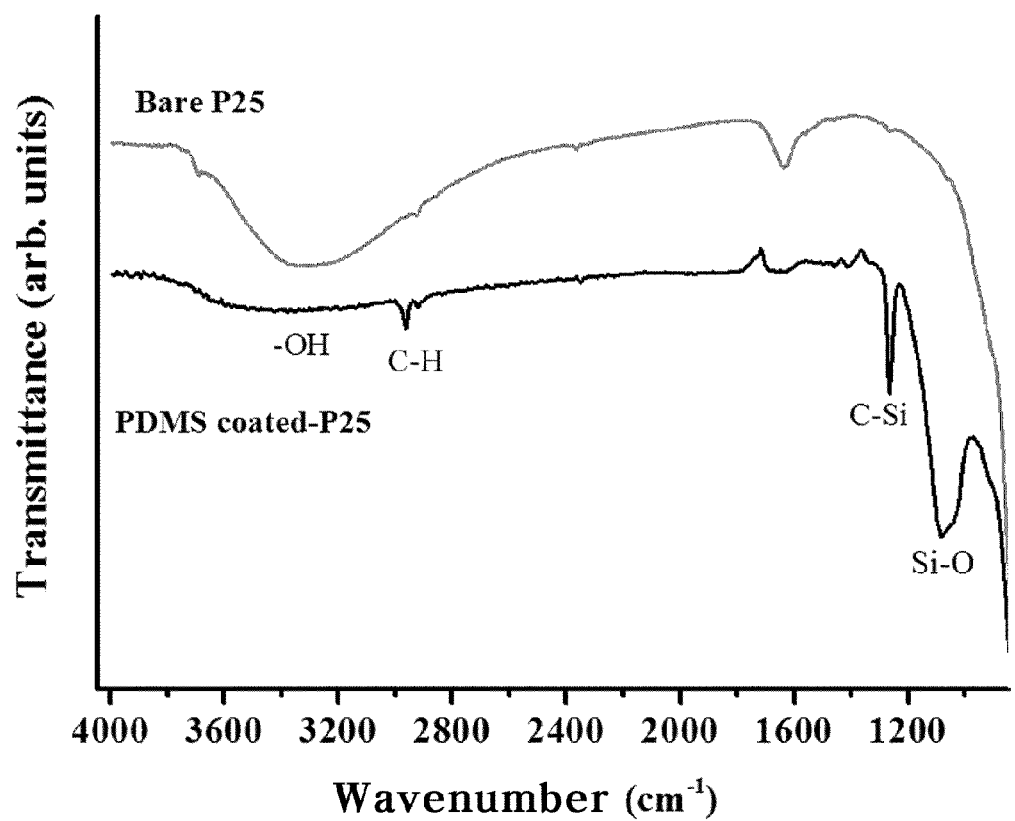
FIG. 2 shows the results of X-ray photoelectron spectroscopy of a P-25 titanium dioxide sample coated with a super-hydrophobic silicon-carbon composite according to the present invention and a non-coated P-25 titanium dioxide sample.

Analysis of Super-Hydrophobic Silicon-Carbon Composite Coating on $TiO_2$ powder by IR Spectroscopy Titanium dioxide was analyzed by IR spectroscopy before and after coating with the super-hydrophobic silicon-carbon composite in Example 1 in order to examine whether the titanium dioxide was coated with the super-hydrophobic silicon-carbon composite. The results of the analysis are shown in FIG. 2.

In the titanium dioxide before coating, a broad band corresponding to an —OH group was observed at 3300 $cm^{-1}$, suggesting that water was adsorbed on the surface of the titanium dioxide or an OH functional group was bound to the surface. In addition, a peak corresponding to —C═O was observed at 1650 $cm^{-1}$, suggesting that partially oxidized carbon impurities were present on the surface of the titanium dioxide. In the titanium dioxide after coating, the peaks of —OH and —O=O disappeared, whereas peaks appearing to C—H, C—Si and Si—O bonds appeared. This suggests that water or carbon impurities present on the surface of the titanium dioxide were removed by coating at 200° C. The peaks corresponding to C—H, C—Si and Si—O bonds produced after the coating process indicate the formation of a composite similar to the polydimethylsiloxane (silicon-carbon composite precursor) used in Example 1.

Test Example 2

Analysis of Super-Hydrophobic Silicon-Carbon Composite Coating on $TiO_2$ Powder by X-Ray Photoelectron Spectroscopy Titanium dioxide was analyzed by X-ray photoelectron spectroscopy before and after coating with the super-hydrophobic silicon-carbon composite in Example 1 in order to examine whether the titanium dioxide was coated with the super-hydrophobic silicon-carbon composite. The results of the analysis are shown in FIG. 3.

Figure 3:
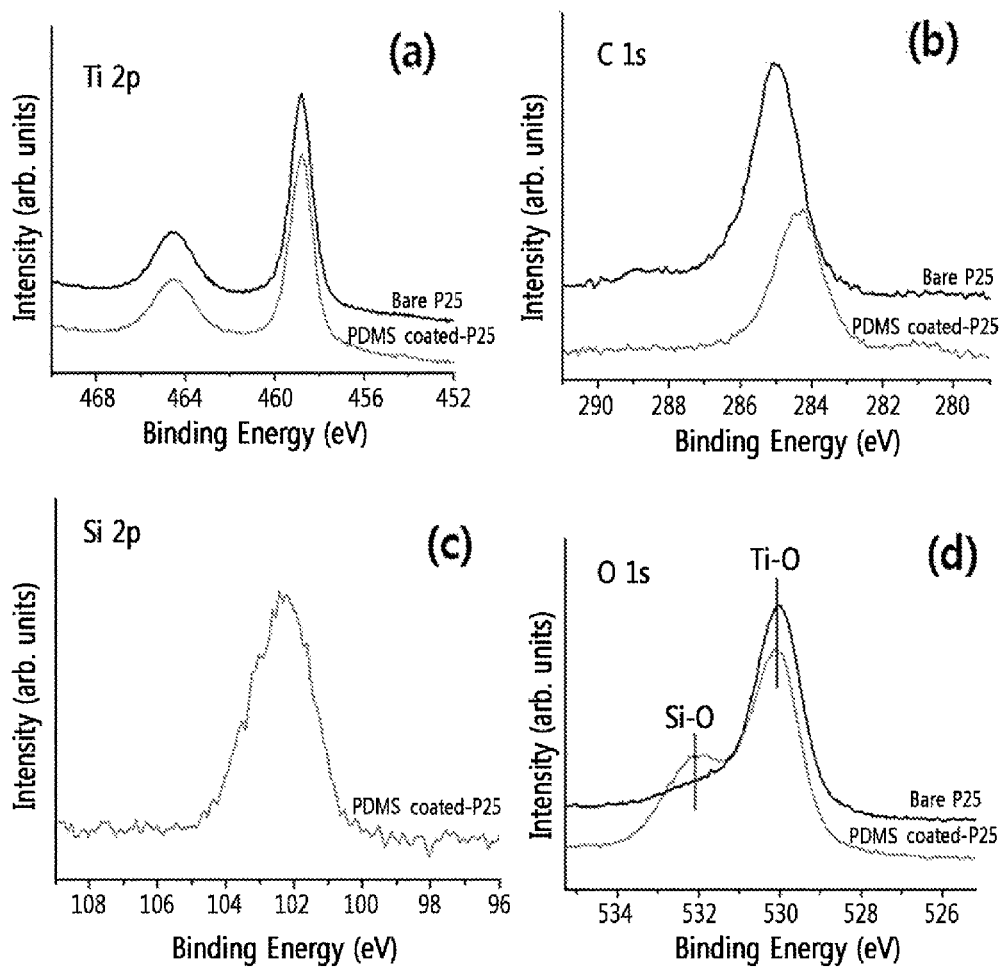
FIG. 3 shows the results of IR spectroscopy of titanium dioxide before and after coating with a super-hydrophobic silicon-carbon composite according to the present invention.

As can be seen in the Ti 2p spectrum of FIG. 3($a$), there was no change before and after coating with the composite. This suggests that the silicon-carbon composite was formed into a thin film having a thickness of less than about 0.5 nm. As can be seen in the C 1s spectrum of the titanium dioxide before coating, a peak at 285 eV and a broad peak at 290 eV appeared. The peak of high binding energy corresponds to a —C=O group, like the results of IR spectroscopy. On the other hand, after coating, the broad peak at 290 eV disappeared, and the binding energy of the C 1s peak corresponding to 285 eV decreased by 0.8 eV. Carbon before coating had high binding energy because of the charge transfer of titanium dioxide toward oxygen, whereas carbon produced by coating with the silicon-carbon composite formed a C—Si or C—H bond, and thus had a relatively low binding energy. This suggests that there was a weak interaction between the silicon-carbon composite coating and the titanium dioxide. When the core level of Si 2p in the titanium dioxide was analyzed after coating with the silicon-carbon composite, it was found that the titanium dioxide had a binding energy of 102.3 eV which was lower than the binding energy of Si 4. Specifically, it could be seen that the titanium dioxide was not coated with $SiO_2$ (completely oxidized form), but was coated with silicon bonds present in the silicon-carbon composite precursor. In addition, as can be seen in the O 1s spectrum, a peak corresponding to a Si—O bond present in the precursor appeared at 532 eV.

Test Example 3

Comparison of Structure Between Coated Titanium Dioxide Particles

The structures of the titanium dioxide particles of Example 1 and Comparative Example 1, coated with the super-hydrophobic silicon carbon composite and the stearic acid, respectively, were measured using a scanning electron microscope.

Specifically, the titanium dioxide coated with the super-hydrophobic silicon-carbon composite was treated with a scanning electron microscope, after it was measured with ethanol and applied to a glass plate, followed by drying. The titanium dioxide coated with stearic acid was measured with a scanning electron microscope, after it was fixed to a glass plate using an epoxy adhesive.

Figure 4:
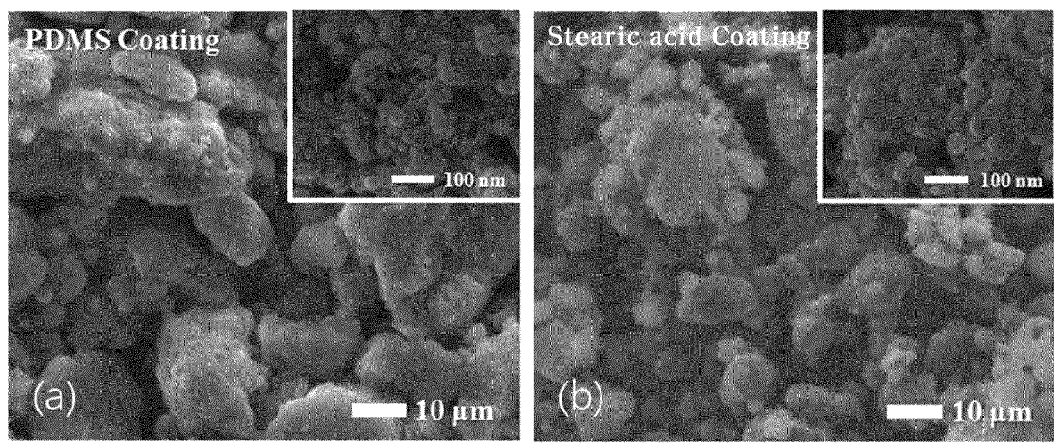
FIG. 4 is a set of photographs showing a comparison between P-25 titanium dioxide samples coated with each of a super-hydrophobic silicon-carbon composite (a) and stearic acid (b).

FIG. 4 is a set of scanning electron micrographs of the titanium dioxide particles fixed to the glass plates as described above.

FIG. 4($a$) is a photograph of the titanium dioxide coated with the super-hydrophobic silicon-carbon composite, and as can be seen therein, the particles had a size of several tens μm. The photograph located at the upper right portion is a photograph enlarged to closely observe these particles. As can be seen in the photograph, the micro-sized particles were composed of titanium dioxide particles having a size of 20-30 nm. As can be seen in FIG. 4($b$), the titanium dioxide coated with stearic acid had a structure similar to that of the titanium dioxide coated with the super-hydrophobic silicon-carbon composite. Specifically, the coated titanium dioxide particles had a double structure composed of nano-sized particles present on micro-sized particles.

Test Example 4

Evaluation of Stability of Coated Composite by Measurement of Water Contact Angle The titanium dioxide particles coated with each of the super-hydrophobic silicon-carbon composite and stearic acid, prepared in Test Example 3, were exposed to UV light (365 nm) for 24 hours, after which these were fixed to glass plates and the water contact angles thereof were measured, thereby evaluating the stability of the coated composite.

Figure 5:
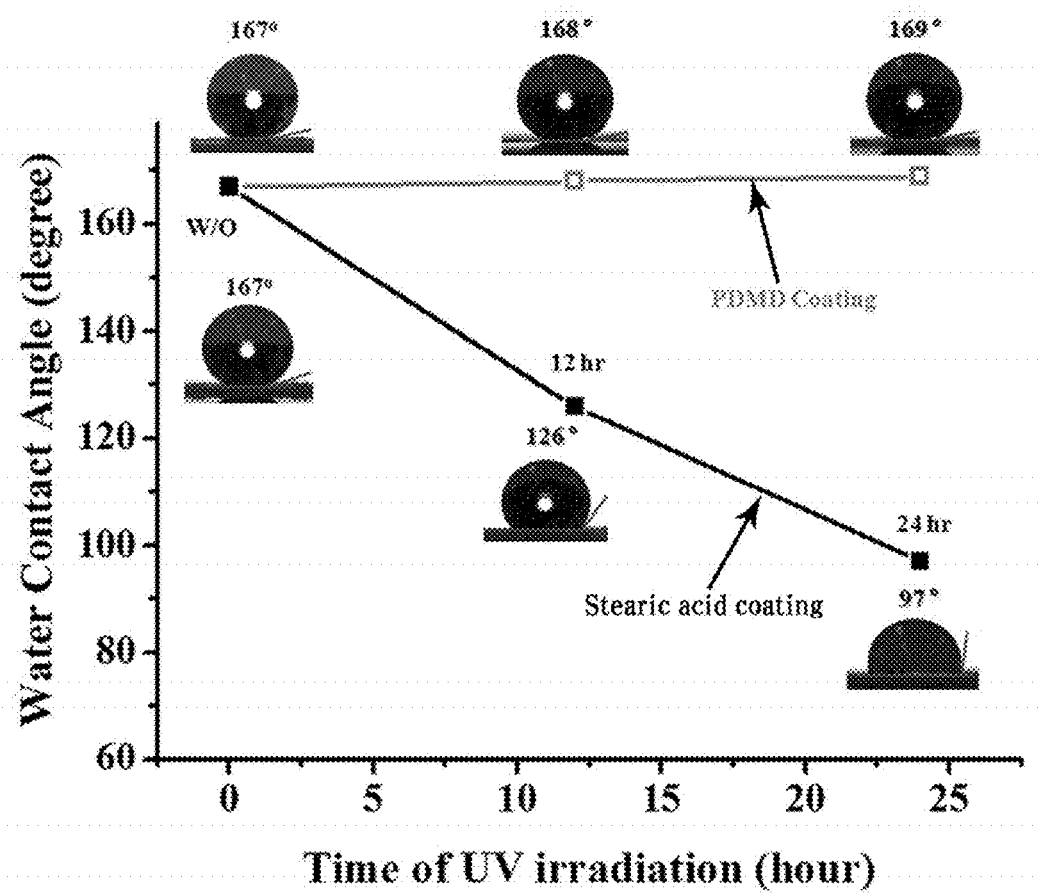
FIG. 5 shows the changes in water contact angles of P-25 titanium dioxide samples coated with each of a super-hydrophobic silicon-carbon composite and stearic acid as a function of the time of irradiation with UV light (365 nm).

The results of the evaluation are shown in FIG. 5.

As can be seen in FIG. 5, the water contact angle of each of the inorganic powder particles before irradiation with UV light was 167°, suggesting that they were super-hydrophobic. The water contact angle of each of the inorganic powder particles was measured after exposure to UV light for 12 hours and 24 hours. In the case of the super-hydrophobic silicon-carbon composite-coated titanium dioxide/glass plate, there was little or no change in the water contact angle. On the other hand, in the case of the stearic acid-coated titanium dioxide/glass plate, it was observed that the water contact angle decreased to 97° after exposure to UV light for 24 hours. From such results, it could be seen that the super-hydrophobic silicon-carbon composite was not degraded or deformed because of its high stability even after exposure to UV light for a long period of time, whereas stearic acid was easily degraded or deformed by UV light, and thus lost its super-hydrophobicity.

Test Example 5

Examination of Stability of Coated Composite Against UV Radiation by Gas Chromatography The stabilities of the titanium dioxide particles of Example 1 and Comparative Example 1 (coated with the super-hydrophobic silicon-carbon composite and stearic acid, respectively) against UV radiation (365 nm) were comparatively evaluated by gas chromatography.

Specifically, 0.03 g of each of the coated inorganic powder particles were placed in a reactor, and water vapor and air were injected into the reactor, and the particles were irradiated with UV light for 24 hours. Then, the change in the amount of carbon dioxide resulting from the degradation of the coated film was measured. The results of the measurement are shown in FIG. 6.

Figure 6:
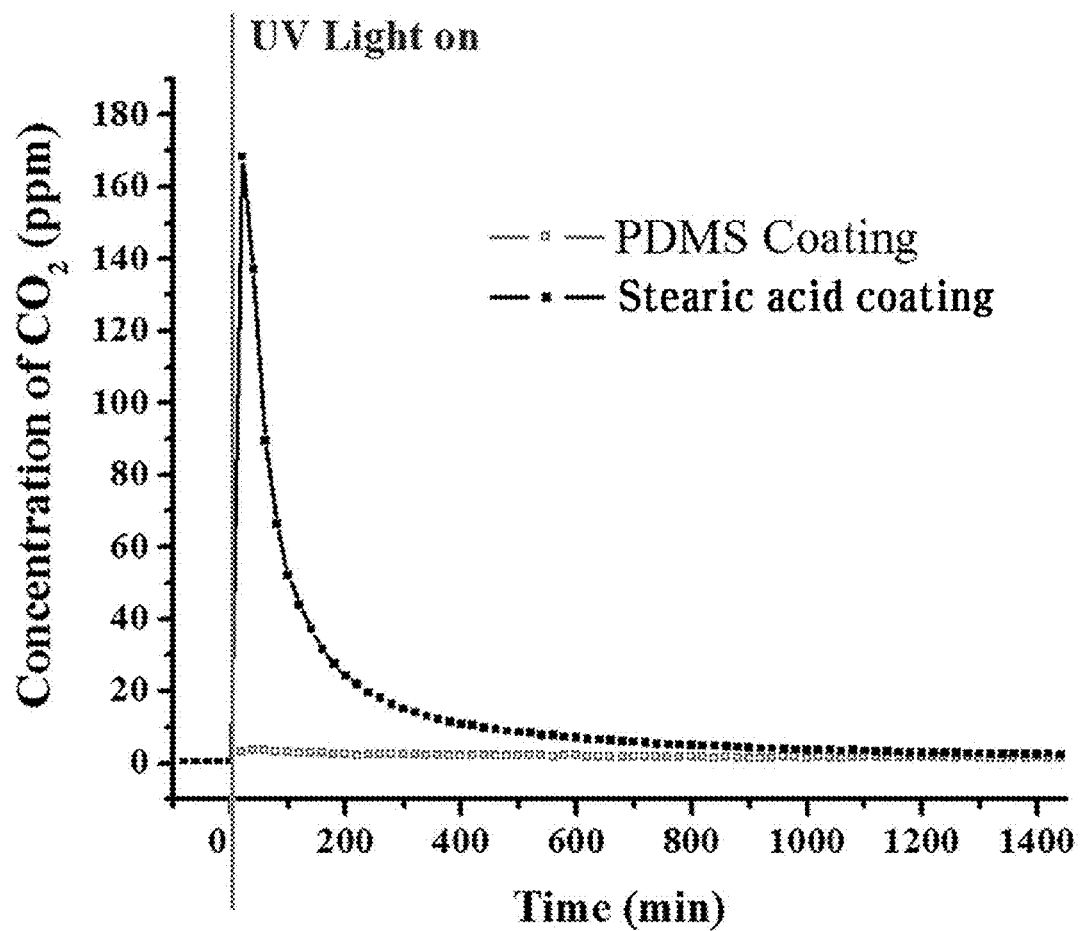
FIG. 6 shows the results of measuring the amount of carbon dioxide generated from P-25 titanium dioxide samples, coated with each of a super-hydrophobic silicon-carbon composite and stearic acid, by Gas Chromatography(GC) as a function of the time of irradiation with UV light (365 nm).

As can be seen in FIG. 6, in the case of the super-hydrophobic silicon-carbon composite, the generation of carbon dioxide by UV light did not substantially occur. This suggests that the super-hydrophobic silicon-carbon composite coating film of the present invention is highly stable against UV light. On the other hand, in the titanium dioxide powder particles coated with stearic acid, it was observed that carbon dioxide was generated in a large amount of 160 ppm or more by irradiation with UV light. This suggests that the stearic acid coating film is easily degraded by irradiation with UV light.

Test Example 6

Examination of Inhibition of Photoactivity of Titanium Dioxide by Super-Hydrophobic Silicon-Carbon Composite Coating In order to examine whether the photoactivity of titanium dioxide is inhibited by the super-hydrophobic silicon-carbon composite coating, the photoactivities of the titanium dioxide particles were comparatively evaluated using gas chromatography.

Specifically, 0.03 g of each of the coated inorganic powder particles were placed in a reactor, and water vapor and toluene together with air were injected into the reactor while the particles were irradiated with UV light (365 nm). The amount of toluene degraded by the photoactivity of titanium dioxide, and the change in the amount of carbon dioxide generated were measured by gas chromatography, and the photoactivities of the particles were compared. The results of the measurement are shown in FIG. 7.

As can be seen in FIG. 7(a), the carbon dioxide before coating with the silicon-carbon composite showed a high rate of removal of toluene by its photoactivity and, at the same time, generated carbon dioxide. On the other hand, after coating with the silicon-carbon composite, toluene was not removed and the generation of carbon dioxide did not occur. Such results suggest that the photoactivity of carbon dioxide was completely inhibited by the silicon-carbon composite coating. That is, it can be seen that, although electron-hole pairs can be induced in titanium dioxide by irradiation with UV light, the silicon-carbon composite prevents titanium dioxide from coming into contact with oxygen or water, thereby preventing the production of strongly reactive species such as OH radicals or $O_2^-$.

Example 2

Preparation of Super-Hydrophobic Copper Powder Coated with Silicon-Carbon Composite Copper powder coated with a super-hydrophobic silicon-carbon composite was prepared in the same manner as Example 1, except that copper powder was used instead of titanium dioxide powder as the inorganic powder particles.

Test Example 7

Analysis of Super-Hydrophobic Silicon-Carbon Composite Coating on Copper Powder by IR Spectroscopy Copper powder particles were analyzed by IR spectroscopy before and after coating with the super-hydrophobic silicon-carbon composite in Example 2 in order to examine whether the copper powder particles were coated with the super-hydrophobic silicon-carbon composite. The results of the analysis are shown in FIG. 8.

Figure 8:
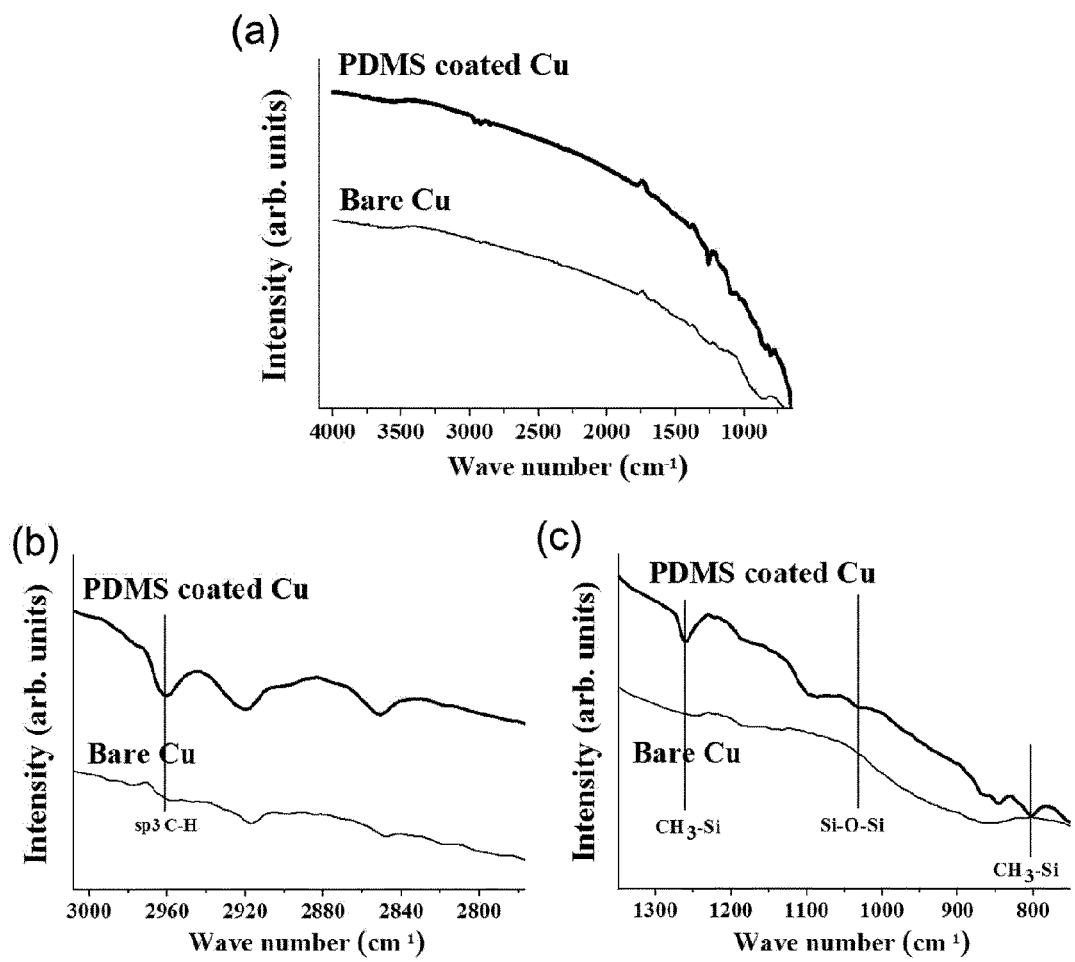
FIG. 8 shows the results of analyzing a copper powder sample by IR spectroscopy before and after coating with a super-hydrophobic silicon-carbon composite according to the present invention.

As can be seen in FIG. 8(a), after coating with the super-hydrophobic silicon-carbon composite, peaks corresponding to $sp^3$ C—H, $CH_3$—Si and Si—O—Si bonds were observed. FIGS. 8(b) and 8(c) show spectra obtained by enlarging the ranges of 700-1400 and 2800-3000 $cm^{-1}$, respectively, to closely observe the peaks produced by a super-hydrophobic silicon-carbon composite. The results in FIG. 8 suggest that the copper powder was coated with the super-hydrophobic silicon-carbon composite.

Test Example 8

Analysis of Oxidation Behavior of Copper Powder Before and after Coating with Super-Hydrophobic Silicon-Carbon Composite The oxidation behavior of copper powder was analyzed by thermogravimetry/differential thermal analysis (TG/DTA) before and after coating with the super-hydrophobic silicon-carbon composite in Example 2.

The thermogravimetry/differential thermal analysis used in this Test Example is a method of measuring the change in weight of inorganic powder particles while increasing temperature at a constant rate. Namely, in this analysis method, the chemical changes (such as oxidation and reduction) or physical changes of inorganic powder particles can be analyzed based on the change in weight of the inorganic powder particles caused by the change in temperature.

Figure 9:
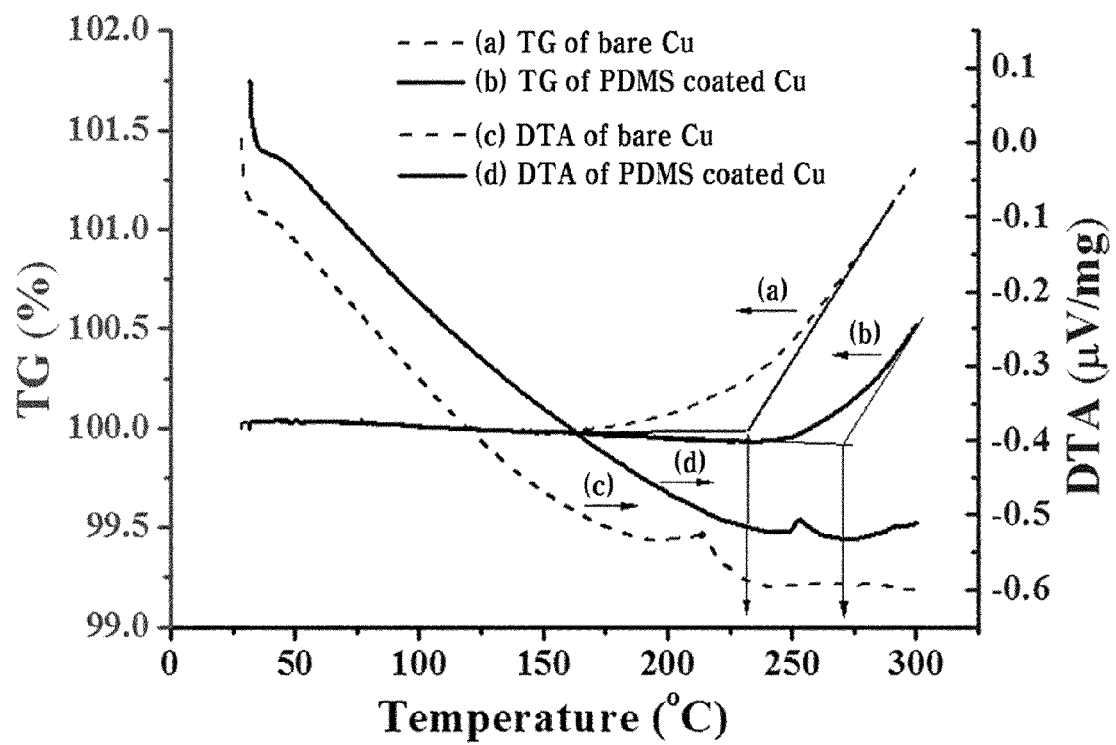
FIG. 9 shows the TG/DTA spectra of copper powder, obtained by thermogravimetry/differential thermal analysis, before (dotted line) and after (curved line) coating with a super-hydrophobic silicon-carbon composite.

FIG. 9 shows the TG/DTA spectra of copper powder before and after coating with the super-hydrophobic silicon-carbon composite.

As can be seen from the DTA spectrum in FIG. 9, copper powder before coating started to oxidize at a temperature lower than 200° C. From the extrapolated results of the TG spectrum, it can be seen that the weight of copper powder changed rapidly at about 230° C. It appears that this change in the weight of copper powder is attributable to the oxidation/reduction reaction between copper and water or oxygen. On the other hand, the copper powder coated with the silicon-carbon composite started to oxidize at about 250° C., and from the extrapolated results of the TG spectrum, it can be seen that the change in weight of the coated copper powder appeared at a temperature higher than the non-coated copper by about 40° C. Such results suggest that the copper powder coated with the silicon-carbon composite is oxidized at a temperature higher than that for the non-coated copper powder and that the silicon-carbon composite coating functions to inhibit the oxidation of copper powder.

Example 3

Method of Silicon-Carbon Composite Coating Using Polydimethylsiloxane Gel

Figure 10:
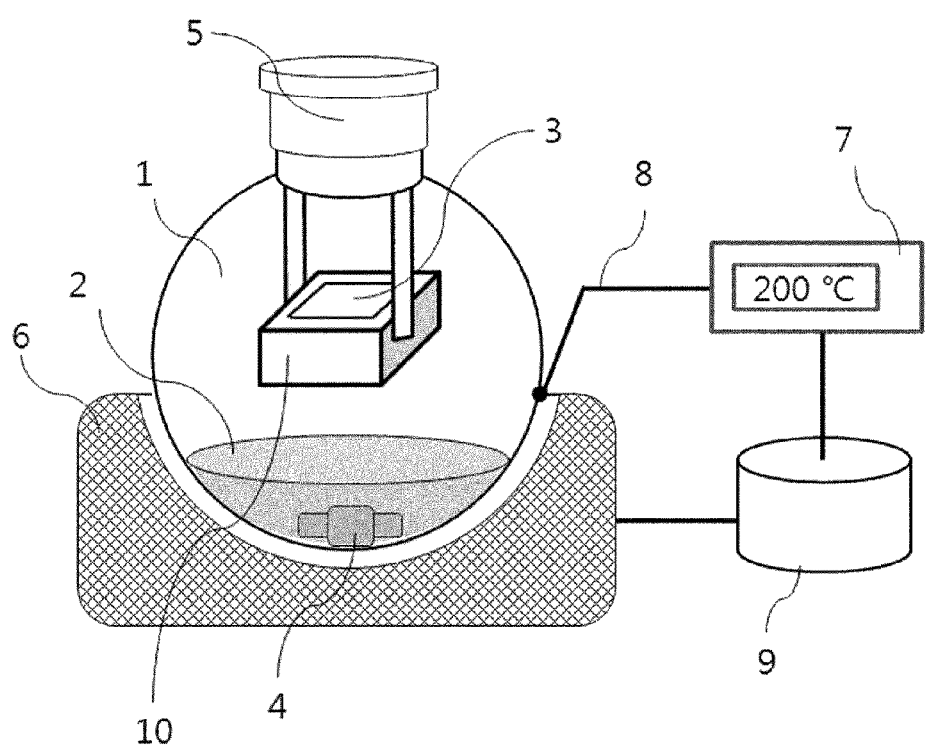
FIG. 10 schematically shows an apparatus for coating with a super-hydrophobic silicon-carbon composite according to the present invention.

As shown in FIG. 10, inorganic powder particles 2 were placed in a reactor 1, and magnetic stirrer 4 was placed in the reactor in order to uniformly coat the surface of the inorganic powder particles with the composite, after which the reactor was sealed with a rubber stopper 5. In order to use Si—C precursor, polydimethylsiloxane (PDMS) 3, directly in gel phase without solidification, a vessel 10 was prepared in the reactor to hold polydimethylsiloxane 3 in gel phase. Using this vessel 10 can inhibit for polydimethylsiloxane 3 in gel phase direct contact of, with inorganic powder. The inorganic powder particles 2 used in Example 3 were Degussa P-25 titanium dioxide powder particles (about 20-30 nm). The above-prepared reactor was equipped with a heating mesh bag and a magnetic stirrer device 6, and the inorganic powder particles were uniformly stirred during the process. Using a temperature controller 7, a thermocouple 8 and a voltage controller 9, the reactor was heated and maintained at 200° C. for 1 hour. After the above process, titanium dioxide powder particles coated with a super-hydrophobic silicon-carbon composite were obtained.

FIG. 11(*a*) is the results of measuring the water contact angles of titanium dioxide coated with super-hydrophobic silicon-carbon composite according to the present invention. The titanium dioxide powder particles according to the example 3 had a coated with silicon-carbon composite equal to that of the solid polydimethylsiloxane using curing agent is applied to precursor.

Although the preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A method of preparing inorganic powder particles whose surfaces are coated with a silicon-carbon composite, comprising the steps of:
   1) mixing inorganic powder particles with a solid organic silicon polymer to form a mixture; and
   2) heating the mixture for vapor deposition of the solid organic silicon polymer on the surface of the inorganic powder particles.

2. The method of claim 1, wherein the inorganic powder particles are made of one or more selected from the group consisting of titanium dioxide, zinc oxide, zirconium oxide, copper, nickel, carbon fiber and activated carbon.

3. The method of claim 1, further comprising adding a curing agent to an organic silicon polymer to obtain the solid organic silicon polymer.

4. The method of claim 3, wherein the organic silicon polymer is polydimethylsiloxane, polyvinylsiloxane, polyphenylmethylsiloxane, or a combination thereof.

5. The method of claim 3, wherein the curing agent is organic peroxide.

6. The method of claim 5, wherein the organic peroxide is one or more selected from the group consisting of di-(2,4-dichlorobenzoyl)-peroxide, dibenzoyl peroxide, tert-butyl-cumyl peroxide, and di-tert-butyl peroxide.

7. The method of claim 1, wherein the heating is carried out in a closed vessel.

8. The method of claim 1, wherein the heating is carried out at a temperature of 150-300° C.

* * * * *